(12) United States Patent
Ehlers

(10) Patent No.: US 11,674,984 B2
(45) Date of Patent: Jun. 13, 2023

(54) DIRECTIONAL POWER DETECTOR WITH LOW LOSS COUPLING NETWORK

(71) Applicant: Keysight Technologies, Inc., Santa Rosa, CA (US)

(72) Inventor: Eric R. Ehlers, Santa Rosa, CA (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 327 days.

(21) Appl. No.: 16/833,802

(22) Filed: Mar. 30, 2020

(65) Prior Publication Data
US 2021/0302477 A1  Sep. 30, 2021

(51) Int. Cl.
| | |
|---|---|
| *G01R 19/14* | (2006.01) |
| *H01P 5/18* | (2006.01) |
| *H03F 3/45* | (2006.01) |
| *G01R 15/14* | (2006.01) |
| *H01P 1/22* | (2006.01) |

(52) U.S. Cl.
CPC .......... *G01R 19/14* (2013.01); *G01R 15/146* (2013.01); *H01P 1/22* (2013.01); *H01P 5/18* (2013.01); *H03F 3/45475* (2013.01); *H03F 2200/451* (2013.01)

(58) Field of Classification Search
None
See application file for complete search history.

(56) References Cited

U.S. PATENT DOCUMENTS

| | | | |
|---|---|---|---|
| 7,309,994 B2 | 12/2007 | Ehlers et al. | |
| 8,421,553 B2 | 4/2013 | Mukaiyama | |
| 8,704,575 B2 | 4/2014 | Hur et al. | |
| 2006/0197627 A1 | 9/2006 | Ehlers | |

(Continued)

FOREIGN PATENT DOCUMENTS

| | | |
|---|---|---|
| EP | 1898224 B1 | 3/2013 |
| KR | 20010039098 A | 5/2001 |

OTHER PUBLICATIONS

English translation of KR20010039098A, 7 pgs.

(Continued)

*Primary Examiner* — Daniel C Puentes

(57) ABSTRACT

A directional power detector device includes a directional coupling network including a first transmission path connected between a radio frequency (RF) input and an RF output, the first transmission path having a voltage transmission gain A, phase θ and characteristic impedance Zo, a second transmission path having the same voltage transmission gain A, phase θ and characteristic impedance Zo, and a resistor connected between the first transmission path at the RF output and the second transmission path, where the resistor has a value including the characteristic impedance Zo. The directional power detector device further includes a detector diode including an anode connected to the second transmission path and a cathode, a capacitor connected between the cathode of the detector diode and the RF input port, and a detector output connected to the cathode of the detector diode. The detector outputs a DC detector voltage when a forward RF signal is applied to the RF input, and outputs zero DC detector voltage when reverse RF signal is applied to the RF output.

24 Claims, 13 Drawing Sheets

(56) References Cited

U.S. PATENT DOCUMENTS

2011/0037453 A1* 2/2011 Hulsmann .............. G01R 21/10
                                                                   324/76.75
2011/0057746 A1* 3/2011 Yamamoto ................ H01P 5/18
                                                                    333/116

OTHER PUBLICATIONS

Chinese Notification of the Decision to Grant dated Dec. 14, 2021, application No. 202120103380.7, with English translation, 4 pgs.

* cited by examiner

DIRECTIONAL POWER DETECTOR WITH LOW LOSS COUPLING NETWORK

BACKGROUND

Directional power detectors are used for directional power sensing in radio frequency (RF) networks and for automatic leveling circuits (ALC) in RF sources and transmitters. Conventional directional power detectors are typically implemented using detector diodes combined with a variety of directional networks, including couplers and directional bridges. Couplers that incorporate electromagnetically coupled transmission lines generally have good directivity. However, they require matched phase velocities of even and odd mode propagation, which is difficult to achieve with media that is not transverse electromagnetic (TEM) mode media. Also, couplers require a good radio frequency (RF) termination to ground, which again can be difficult to implement.

Waveguide couplers are usually not suitable for integration or insertion into power sensing networks due to their three-dimensional structure. Directional bridges have wider bandwidth than couplers and may be made with resistors or with a combination of resistors, inductors and capacitors. Bridges are typically lumped element designs and it is difficult at microwave frequencies to achieve the required ratios of resistance, inductance and capacitance for a low loss bridge.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
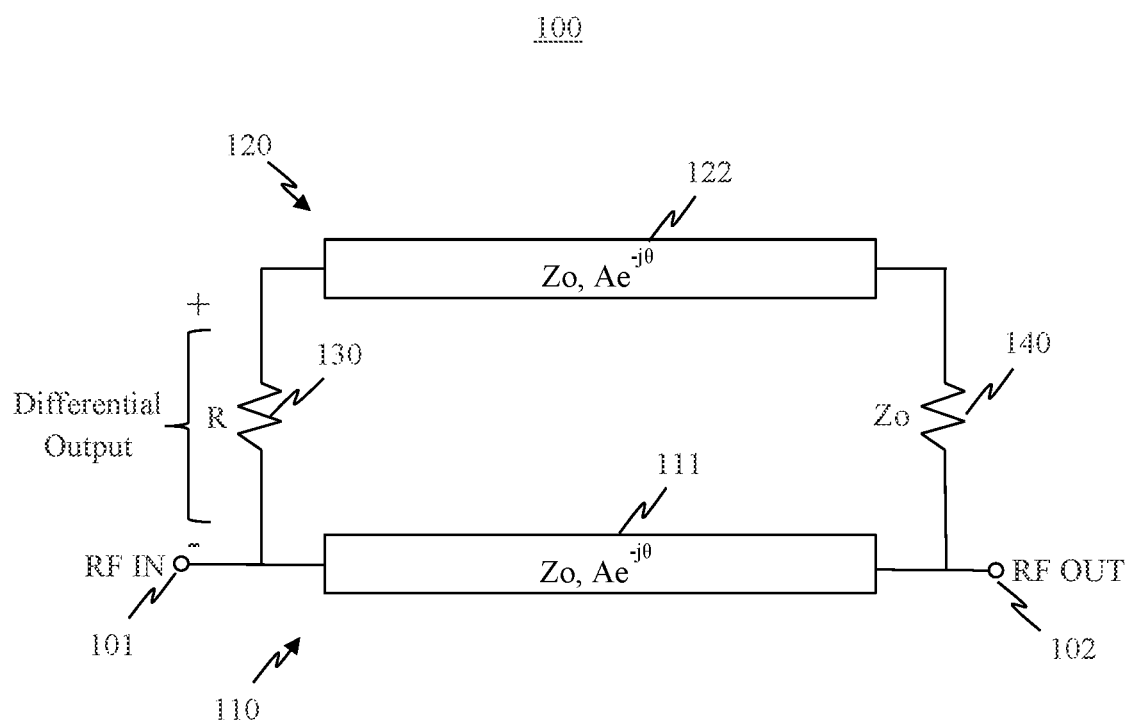
FIG. 1 is a simplified schematic diagram of a directional coupling network, according to a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a", "an" and "the" are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

Generally, according to various embodiments, a low loss directional power detector includes two matched single-mode transmission lines, i.e., a main transmission line and a coupled transmission line, that are not electromagnetically coupled to one another, such that there are no even and odd modes of signal propagation. The main and coupled transmission lines may include matched attenuators. The low loss directional power detector also includes a resistor, connecting the main and coupled transmission lines to one another, that does not have a ground connection, making it is easier to implement in integrated circuit processes than grounded resistors. Also, in an implementation that does not include matched attenuators, there are no series resistors required in the main transmission line, which provides a low insertion loss and allows easy insertion into networks for power sensing. The bandwidth of operation for the low loss directional power detector is multi-octave, although there is an upward slope to the detected power with frequency. In the implementation that uses matched attenuators the loss is higher, but the directional power detector is able to operate at low frequencies.

Accordingly, the low loss directional power detectors according to the various embodiments are easy to implement in integrated circuit processes, particularly since even/odd mode velocity matching is not required and no terminations to ground are required for the embodiments without matched attenuators. Also, the low loss directional power detector is easily inserted into networks for power sensing, as no DC-blocks are required and the insertion loss is low.

FIG. 1 is a simplified schematic diagram of a directional coupling network for a low loss directional power detector, according to a representative embodiment.

Referring to FIG. 1, a directional coupling network 100 includes a first transmission path 110 including a first (main) transmission line 111 and a second transmission path 120 including a second (coupled) transmission line 122, where the second transmission line 122 has the same characteristics as the first transmission line 111 in terms of characteristic impedance Zo and forward voltage transmission gain, indicated by S-parameter $S_{21}$, where $S_{21}$ is a complex number $Ae^{-j\theta}$, in which A is amplitude (magnitude) and θ is phase. The first and second transmission lines 111 and 122 are matched single-mode transmission lines, and may be implemented using coaxial lines, microstrip lines or coplanar waveguide (CPW) lines, for example. The first transmission path 110 extends between an RF input port 101 and an RF output port 102. The second transmission path 120 is connected to the first transmission path 110 through a first a resistor 130 having a value R at one end and through a resistor 140 having a value Zo at an opposite end, where Zo is the same as the characteristic impedance Zo of the first and second transmissions lines 111 and 122. That is, the resistor 130 is connected between the first transmission path 110 at the RF input port 101 and the second transmission path 120, and the resistor 140 is connected between the first transmission path 110 at the RF output port 102 and the second transmission path 120. The resistor 140 does not have a ground connection. In an embodiment, the characteristic impedance Zo may be 50 Ohms, for example, although different impedances (e.g., between about 30 Ohms and about 200 Ohms) may be used without departing from the scope of the present teachings. The characteristic impedance Zo is the ratio of voltage to current of a traveling wave in the first transmission line 111 and the second transmission line 122.

The directional coupling network 100 is directional in that the resistor 130 provides a differential output in response to a forward RF signal input at the RF input port 101, but not in response to a reverse RF signal input at the RF output port 102. That is, a differential output voltage occurs across the resistor 130 when an RF signal is input at the RF input port 101, and no differential output voltage occurs across the resistor 130 when an RF signal input at the RF output port 102. In addition, this enables the differential output to be the voltage difference between two nodes of the resistor 130, as opposed to the voltage difference with respect to ground.

The directional character of the directional coupling network 100 may be shown by mathematical relationships indicating forward voltage gain, reverse voltage gain, and insertion voltage gain. Referring to FIG. 1, the network was analyzed with Mason's Gain Rule to yield the following voltage gain equations with Zo reference impedance:

$$\text{Forward voltage gain} \approx [2R/(2R+3Zo)](A^2e^{-j2\theta}-1) \quad (1)$$

$$\text{Reverse voltage gain} = 0 \text{ for all values of } R, Zo, \theta, \text{ and } A \quad (2)$$

$$\text{Insertion voltage gain} = 4Ae^{-j\theta}/(5-A^2e^{-j\theta}) \text{ for all values of } R \text{ and } Zo \quad (3)$$

As indicated, the reverse gain is 0 for all resistance values R of the resistor 130, all impedance values Zo of the resistor 140 (as well as the characteristic impedance of the first and second transmission lines 111 and 122) and all values of the amplitude A and the phase θ of $S_{21}$ for the first and second transmission lines 111 and 122. This confirms the directional nature of the directional coupling network 100. As indicated, the insertion voltage gain is only dependent on the transmission line magnitude and phase. For insertion voltage gain to be near one in magnitude (i.e., low insertion loss), the transmission line magnitude A should be near or equal to one and the transmission line phase θ should be small compared to 180 degrees. For example, when A=1 and the phase θ is less than 18 degrees, the insertion loss is less than 0.5 dB.

Figure 2:
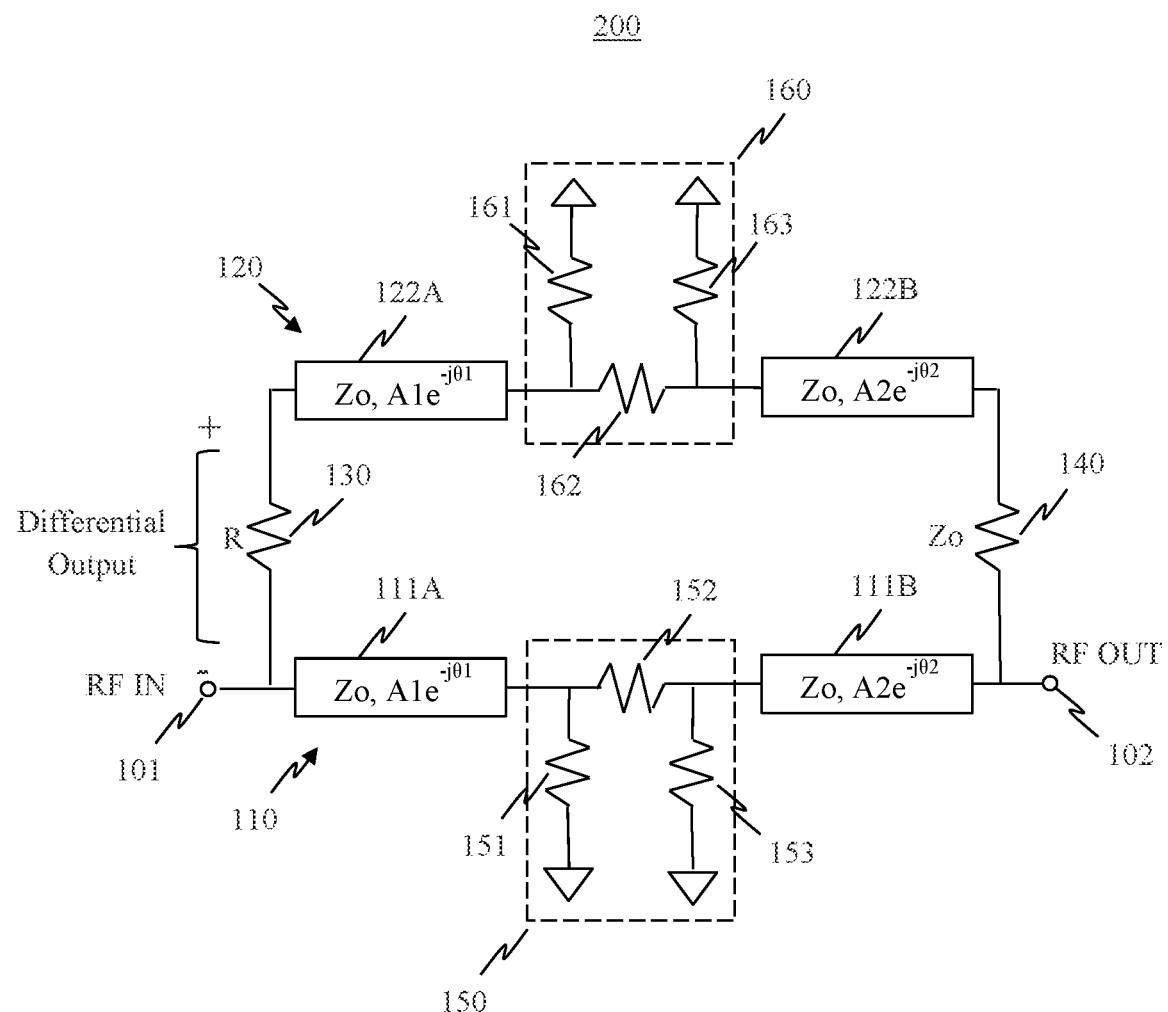
FIG. 2 is a simplified schematic diagram of a directional coupling network including matched attenuators, according to a representative embodiment.

FIG. 2 is a simplified schematic diagram of a directional coupling network including matched attenuators in both transmission paths, according to a representative embodiment.

Referring to FIG. 2, a directional coupling network 200, which is similar to the directional coupling network 100 in FIG. 1, further includes a first attenuator 150 in the first transmission path 110 and a second attenuator 160 in the second transmission path 120. In the depicted embodiment, the first attenuator 150 divides the first transmission line (111) into a first transmission line segment 111A and a second transmission line segment 111B, and the second attenuator 160 divides the second transmission line (122) into a first transmission line segment 122A and a second transmission line segment 122B. The characteristic impedance for each of the first transmission line segments 111A and 122A and each of the second transmission line segments 111B and 122B is Zo. The forward voltage transmission gain for each of the first line transmission segments 111A and 121A is indicated by $A1e^{-j\theta_1}$, and the forward voltage transmission gain for each of the second transmission line segments 111B and 122B is indicated by $A2e^{-j\theta_2}$.

Each of the first and second attenuators 150 and 160 has a characteristic impedance that is Zo. Also, the first attenuator 150 has a corresponding first attenuator forward voltage transmission gain (first $S_{21}$), including amplitude and phase, and the second attenuator 160 has a corresponding second attenuator forward voltage transmission gain (second $S_{21}$), including amplitude and phase. The first and second attenuator forward voltage transmission gains are equal to each other.

In general, directional coupling networks that include matched attenuators may have higher loss than directional coupling networks that do not include matched attenuators. However, directional coupling networks that include matched attenuators, such as directional coupling network 200 and the other directional coupling networks discussed herein that similarly include matched attenuators, are desirable in certain situations, such as handling RF signals at lower RF frequencies and/or when biasing networks can be incorporated into the matched attenuators, for example. When there are no attenuators in a directional coupling network, as in FIG. 1, the amplitude A is equal to one in equations (1), (2) and (3). As the frequency goes down to 0 Hz, the phase θ in equations (1), (2) and (3) goes to 0 degrees, and the forward voltage gain goes to 0. In other words, the coupling network in FIG. 1 and described by equations (1), (2) and (3) does not work at DC. When there are matched attenuators in a directional coupling network, as in FIG. 2 for example, the amplitude A is less than one in equations (1), (2) and (3), and the forward voltage gain does not go to 0 as the frequency and phase θ go to 0, such that the coupling network will work at DC. When the coupling network is included in a directional power detector, along with coupling capacitors (e.g., coupling capacitors 435, 445 as shown in FIGS. 4 through 9), the coupling capacitors will establish the low frequency limit. To make a useful directional power detector, the coupling capacitors need to be large in value so that their impedance is low (typically less than 10 Ohms) at the lowest frequency of operation.

The forward voltage transmission gain $S_{21}$ of each of the first and second transmission paths 110 and 120 is modified to include the first and second forward voltage transmission gains $S_{21}$ of each of the first and second attenuators 150 and 160, respectively. That is, the amplitude A of the forward voltage transmission gain of the first transmission path 110 is the product of the segment amplitudes of the first and second transmission line segments 111A and 111B and the forward voltage transmission gain amplitude of the first attenuator 150, and the phase θ of the forward voltage transmission gain of the first transmission path 110 is the sum of the segment phases of the first and second transmission line segments 111A and 111B and the forward voltage transmission gain phase of the first attenuator 150. Likewise, the amplitude A of forward voltage transmission gain of the second transmission path 120 is the product of the segment amplitudes of the first and second transmission line segments 122A and 122B and the forward voltage transmission gain amplitude of the second attenuator 160, and the phase θ of the forward voltage transmission gain of the second transmission path 120 is the sum of the segment phases of the first and second transmission line segments 122A and 122B and forward voltage transmission gain phase of the second attenuator 150.

As discussed above, the first transmission path 110 extends between the RF input port 101 and the RF output port 102. The second transmission path 120 is connected to the first transmission path 110 through the resistors 130 and 140. That is, the resistor 130 is connected between the first transmission path 110 at the RF input port 101 and the second transmission path 120, and the resistor 140 (having value Zo) is connected between the first transmission path 110 at the RF output port 102 and the second transmission path 120.

The first attenuator 150 is in the first transmission path 110, and includes a first resistor 151 connected between a node 154 in the first transmission path 110 and ground, a second resistor 152 connected between the node 154 and a node 155 also in the first transmission path 110, and a third resistor 153 connected between the node 155 and ground. In the depicted embodiment, the first, second and third resistors 151, 152 and 153 of the first attenuator 150 are arranged to act as a Pi-attenuator. Alternatively, the first, second and third resistors 151, 152 and 153 (as well as resistors in other attenuators described herein) may be arranged in a T-attenuator topology, as would be apparent to one skilled in the art, without departing from the scope of the present teachings. The second attenuator 160 is in the second transmission path 120, and includes a first resistor 161 connected between a node 164 in the second transmission path 120 and ground, a second resistor 162 connected between the node 164 and a node 165 also in the second transmission path 120, and a third resistor 163 connected between the node 165 and ground.

Each of the first and second attenuators 150 and 160 ideally has low loss, which means that the resistances of the first and third resistors 151, 161 and 153, 163 are large (e.g., 1 kOhm or higher) compared to the impedance Zo. In addition, the resistances of the corresponding resistors in the first and second attenuators 150 and 160 are the same, respectively. That is, the resistances of the first resistors 151 and 161 are the same, the resistances of the second resistors 152 and 162 are the same, and the resistances of the third resistors 153 and 163 are the same. Accordingly, the forward voltage transmission gains $S_{21}$ of the first and second transmission lines 111 and 121 change in the same manner.

For purposes of illustration, the first and second attenuators 150 and 160 are shown substantially centered in the first and second transmission paths 110 and 120, respectively. However, it is understood that the first and second attenuators 150 and 160 may be inserted anywhere along the first and second transmission paths 110 and 120, without departing from the scope of the present teachings. Also, to the extent either or both of the first attenuator 150 or and the second attenuator 160 is inserted at the end of the first transmission path 110 or the second transmission path 120, there would be no need for separate line segments for determining the forward voltage transmission gains. Rather, the first transmission path 110 would include the first attenuator 150 connected in series to a first transmission line (e.g., first transmission line 111), and the second transmission path 120 would include the second attenuator 160 connected in series with a second transmission line (e.g., second transmission line 122). Accordingly, the forward voltage transmission gain amplitude of the first transmission path 110 would be the product of the forward voltage transmission gain amplitudes of the first attenuator 150 and the first transmission line, and the forward voltage transmission gain phase of the first transmission path 110 would be the sum of the forward voltage transmission gain phases of the first attenuator 150 and the first transmission line. Likewise, the forward voltage transmission gain amplitude of the second transmission path 120 would be the product of the forward voltage transmission gain amplitudes of the second attenuator 160 and the second transmission line, and the forward voltage transmission gain phase of the second transmission path 120 would be the sum of the forward voltage transmission gain phases of the second attenuator 160 and the second transmission line.

Figure 3:
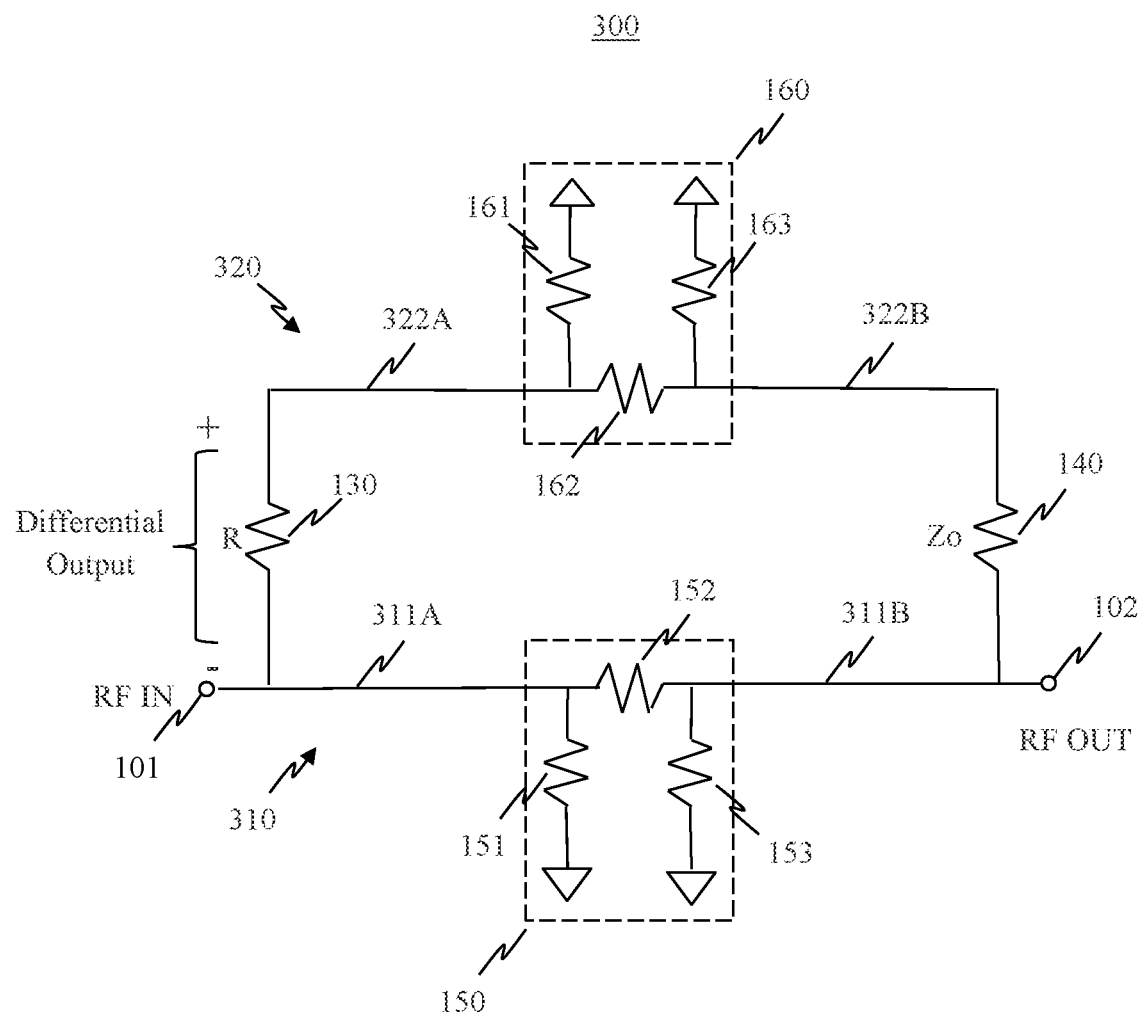
FIG. 3 is a simplified schematic diagram of a directional coupling network including matched attenuators and no transmission lines, according to a representative embodiment.

FIG. 3 is a simplified schematic diagram of a directional coupling network including matched attenuators and no transmission lines, according to a representative embodiment.

Referring to FIG. 3, a directional coupling network 300 is similar to the directional coupling network 200 in FIG. 2 with the phase of the transmission line segments all set to zero. This means that the input and output ports of the attenuators are directly connected to the rest of the circuit. The attenuators are matched to characteristic impedance Zo even though there are no physical transmission lines. For descriptive purposes, the transmission lines with zero phase will be referred to as wires in FIG. 3, as well as in any other figures showing transmission line segments with phase set to zero.

Accordingly, the directional coupling network 300 includes a first transmission path 310 that extends between the RF input port 101 and the RF output port 102, and includes a first wire 311A, the first attenuator 150, and a second wire 311B. The directional coupling network 300 further includes a second transmission path 320 connected to the first transmission path 310 through the resistors 130 and 140, where the first resistor 130 is connected between the first transmission path 310 at the RF input port 101 and the second transmission path 320, and the resistor 140 (having value Zo) is connected between the first transmission path 310 at the RF output port 102 and the second transmission path 320. The second transmission path 320 includes a first wire 322A, the second attenuator 160, and a second wire 322B.

The transmission paths of the directional coupling network 300 are provided by the matched first and second attenuators 150 and 160. That is, each of the first and second attenuators 150 and 160 has a characteristic impedance that is matched to Zo. Also, the first attenuator 150 has a corresponding first attenuator forward voltage transmission gain, including amplitude and phase, and the second attenuator 160 has a corresponding second attenuator forward voltage transmission gain, including amplitude and phase. In this configuration, the forward voltage transmission gain amplitude A of the first transmission path 310 is the amplitude of the forward voltage transmission gain of the first attenuator 150, and the forward voltage transmission gain phase θ of the first transmission path 310 is the forward voltage transmission gain phase of the first attenuator 150. Likewise, the forward voltage transmission gain amplitude A of the second transmission path 320 is the amplitude of the forward voltage transmission gain of the second attenuator 160, and the forward voltage transmission gain phase θ of the second transmission path 320 is the forward voltage transmission gain phase of the second attenuator 160.

Similar to the discussion above, the first attenuator 150 includes a second resistor 152 in the first wire 110, and each of the first and third resistors 151 and 153 respectively connected between nodes 154 and 155 on either side of the second resistor 152 and ground. The second attenuator 160 includes a second resistor 162, and each of the first and third resistors 161 and 163 respectively connected between nodes 164 and 165 on either side of the second resistor 162 and ground. When there is attenuation, e.g., provided by the first and second attenuators 150 and 160, the amplitude of the forward voltage transmission gain is less than 1, so there is forward voltage transmission gain even though the phase of the wires in the first and second transmission paths 310 and 320 is zero. Therefore, with the first and second attenuators 150 and 160 connected with the wires in the first and second transmission paths 310 and 320, there is still forward voltage transmission gain and perfect directivity of the directional coupling network 300, where directivity is the ratio of the forward voltage to the reverse voltage of the directional coupling network 300. In other words, the directional coupling network 300 effectively becomes a purely resistive directional bridge. Notably, directivity is usually specified in dB, so perfect directivity is negative infinity dB.

Figure 4:
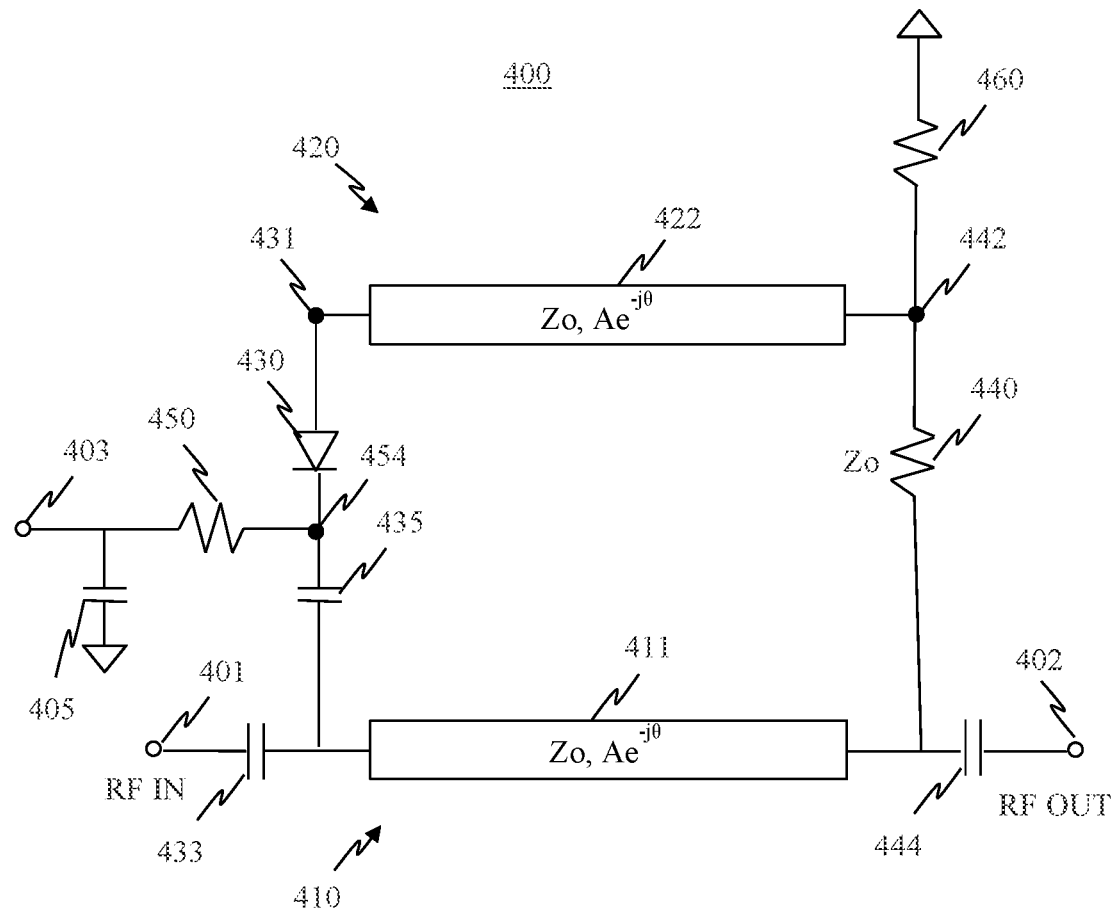
FIG. 4 is a simplified schematic diagram of a low loss directional power detector, including the directional coupling network of FIG. 1, according to a representative embodiment.

FIG. 4 is a simplified schematic diagram of a low loss directional power detector, including the directional coupling network of FIG. 1, according to a representative embodiment, including direct current (DC) blocking capacitors.

Referring to FIG. 4, a directional power detector 400 includes a first transmission path 410 including a first (main) transmission line 411 and a second transmission path 420 including a second (coupled) transmission line 422, where the first transmission path 410 extends between an RF input port 401 and an RF output port 402. The second transmission line 422 has the same characteristics as the first transmission line 411 in terms of characteristic impedance Zo and forward voltage transmission gain $Ae^{-j\theta}$. The first and second transmission lines 411 and 422 are matched single-mode transmission lines.

A coupling capacitor 435 and a detector diode 430 are connected in series between the first transmission path 410 at the RF input port 401 and the second transmission path 420 at a node 431. The resistance Rvideo of the detector diode 430 effectively replaces the resistance of the resistor 130 of the directional coupling network 100 in FIG. 1. Rvideo is the resistance of the detector diode 430 at low voltages. Low voltage means that the RF voltage across the detector diode 430 is typically less than about 0.1 V, where the detector diode 430 operates in the "square law region." In the square law region, the DC detector output is proportional to the square of the RF voltage across the detector diode 430, that is, the DC detector output is proportional to power. For a zero-biased detector diode 430, for example, Rvideo is generally about 1 kOhm to about 10 kOhm. If the detector diode 430 is not zero-biased, it must be forward biased to achieve these values of Rvideo, as discussed below. An anode of the detector diode 430 is connected to the node 431 and a cathode of the detector diode 430 is connected to the coupling capacitor 435. The coupling capacitor 435 is a non-critical coupling capacitor with low impedance (e.g., 10 Ohms or less) at the frequency of operation. A resistor 440 having a value Zo is connected between the first transmission path 410 at the RF output port 402 and the second transmission path 420 at a node 442. The value Zo of the resistor 440 may be 50 Ohms, for example, although different impedance values may be incorporated without departing from the scope of the present teachings.

Generally, the detector diode 430 may be any diode that has suitable frequency response. If it is not a zero-biased detector diode, the detector diode 430 must be biased, and there must be an additional reference diode (not part of the RF circuitry) that is biased the same way. The DC voltage across the reference diode is subtracted from the DC voltage across the detector diode 430, and the DC difference voltage is proportional to RF power when the detector diode 430 is in the square law region. Or, the detector diode 430 may be a zero biased detector diode, discussed above, which does not need to be biased with voltage or current, but does require a bias network to allow measurement of the voltage across the detector diode 430.

Since the detector diode 430 is not DC isolated from the first transmission line 411, DC blocking capacitors are required at the RF input port 401 and the RF output port 402. That is, a first DC block capacitor 433 is connected between the RF input port 401 and the first transmission line 411, and a second DC blocking capacitor 444 is connected between the first transmission line 411 and the RF output port 402.

The directional power detector 400 further includes a first shunt resistor 450 and a second shunt resistor 460. The first and second shunt resistors 450 and 460 may be DC resistors, for example, where the first shunt resistor 450 has a first resistance and the second shunt resistor 460 has a second resistance. The first shunt resistor 450 is connected between a node 454 and a detector output 403, where the node 454 is located between the detector diode 430 and the coupling capacitor 435. The detector output 403 is connected to ground through a shunt capacitor 405. The detector output 403 outputs a DC detector voltage indicating the power of an RF signal input at the RF input port 401, and provides no detector voltage in response to an RF signal input at the RF output port 402. The DC detector voltage at the detector output 403 is the DC voltage at the node 454. The required DC ground connection is through the second transmission line 422 and the second shunt resistor 460. This DC detector voltage is generated by the rectification of the RF voltage across the detector diode 430. At low RF power levels, the DC detector voltage is proportional to the square of the voltage across the detector diode 430, which is the differential RF voltage between nodes 431 and 454. The RF differential voltage between nodes 431 and 454 is zero for an RF signal entering the RF output port 402 and as a result the voltage at the DC detector output 403 is zero.

The first shunt resistor 450 and the second shunt resistor 460 are not present in the embodiments shown in FIGS. 1, 2 and 3, and therefore the voltage gain equations (1), (2) and (3) do not strictly apply to the directional power detector 400. The practical effect of the first and second shunt resistors 450 and 460 is to degrade the directivity, meaning that the RF voltage between the nodes 454 and 431 is not exactly zero when an RF signal enters the RF output port 402, and to increase insertion loss. Accordingly, each of the first resistance and the second resistance should be large compared to the characteristic impedance Zo. For example, each of the first and second resistances may be at least about 20 times greater than the characteristic impedance Zo, although other resistances may be incorporated, without departing from the scope of the present teachings. Generally, it is desirable to select first and second resistances that would add less than about 0.20 dB of insertion loss overall to the directional power detector 400 at low frequencies.

Figure 5:
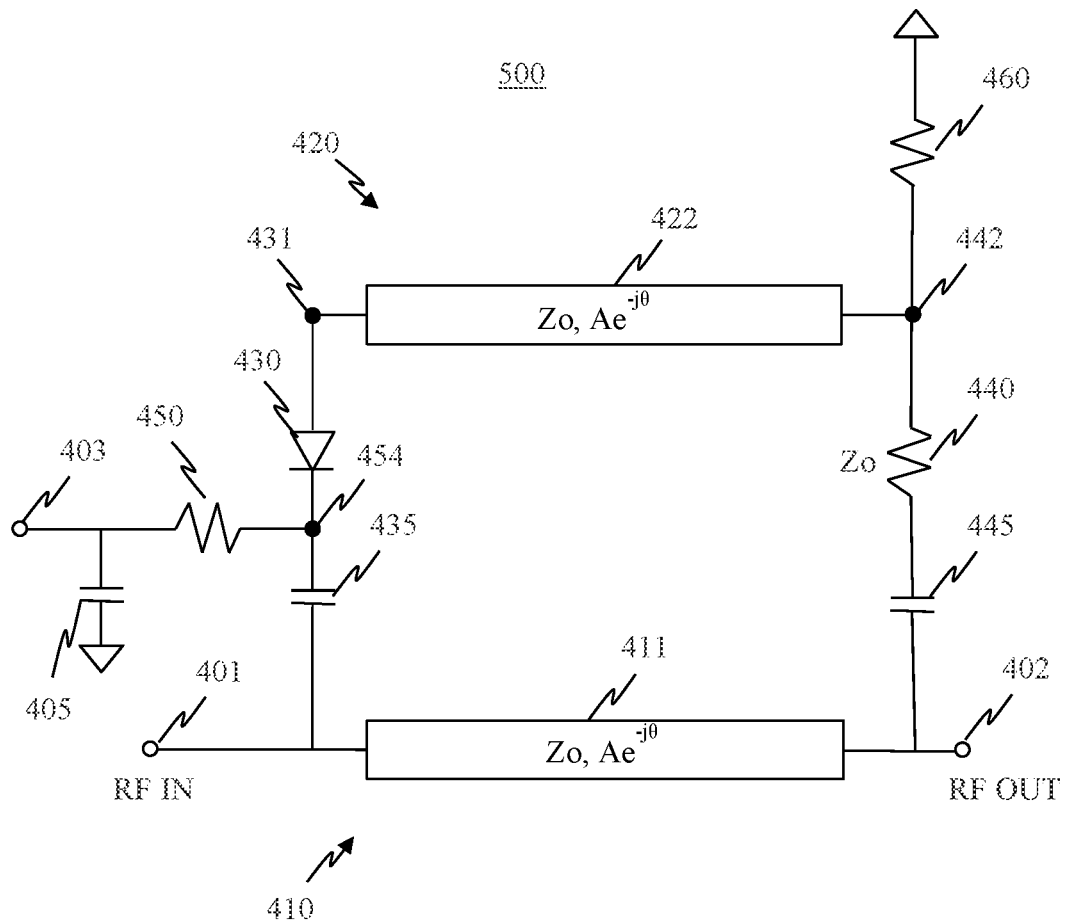
FIG. 5 is a simplified schematic diagram of a low loss directional power detector, including the directional coupling network of FIG. 1, according to a representative embodiment.

FIG. 5 is a simplified schematic diagram of a low loss directional power detector, including the directional coupling network of FIG. 1, according to a representative embodiment, in which coupling capacitors DC isolate the detector diode from the main transmission line.

Referring to FIG. 5, a directional power detector 500 includes first transmission path 410 including first transmission line 411 and second transmission path 420 including second transmission line 422, where the first transmission path 410 extends between RF input port 401 and RF output port 402. The first and second transmission lines 411 and 422 have the same characteristic impedance Zo and forward voltage transmission gain $Ae^{-j\theta}$, as discussed above.

First coupling capacitor 435 and detector diode 430 are connected in series between the first transmission path 410 at the RF input port 401 and the second transmission path 420 at a node 431, as discussed above. A second coupling capacitor 445 and resistor 440 are connected in series between the first transmission path 410 at the RF output port 402 and the second transmission path 420 at a node 442. The first and second coupling capacitors 435 and 445 are non-critical coupling capacitors with low impedances (e.g., less than a few Ohms) at the frequency of operation. Again, the value Zo of the resistor 440 may be 50 Ohms, for example, although different impedance values may be incorporated without departing from the scope of the present teachings. Since the detector diode 430 is DC isolated from the first transmission line 411 by the first and second coupling capacitors 445, DC blocking capacitors (e.g. first and second DC blocking capacitors 433 and 444) are not needed at the RF input port 401 and the RF output port 402, as in FIG. 4. Again, because of the presence of the first and second shunt resistors 450 and 460, the voltage gain equations (1), (2) and (3) do not strictly apply to the directional power detector 500. The practical effect of the first and second shunt resistors 450 and 460 is to degrade the directivity, meaning that the RF voltage between the nodes 454 and 431 is not exactly zero when an RF signal enters the RF output port 402, and to increase insertion loss.

Figure 6:
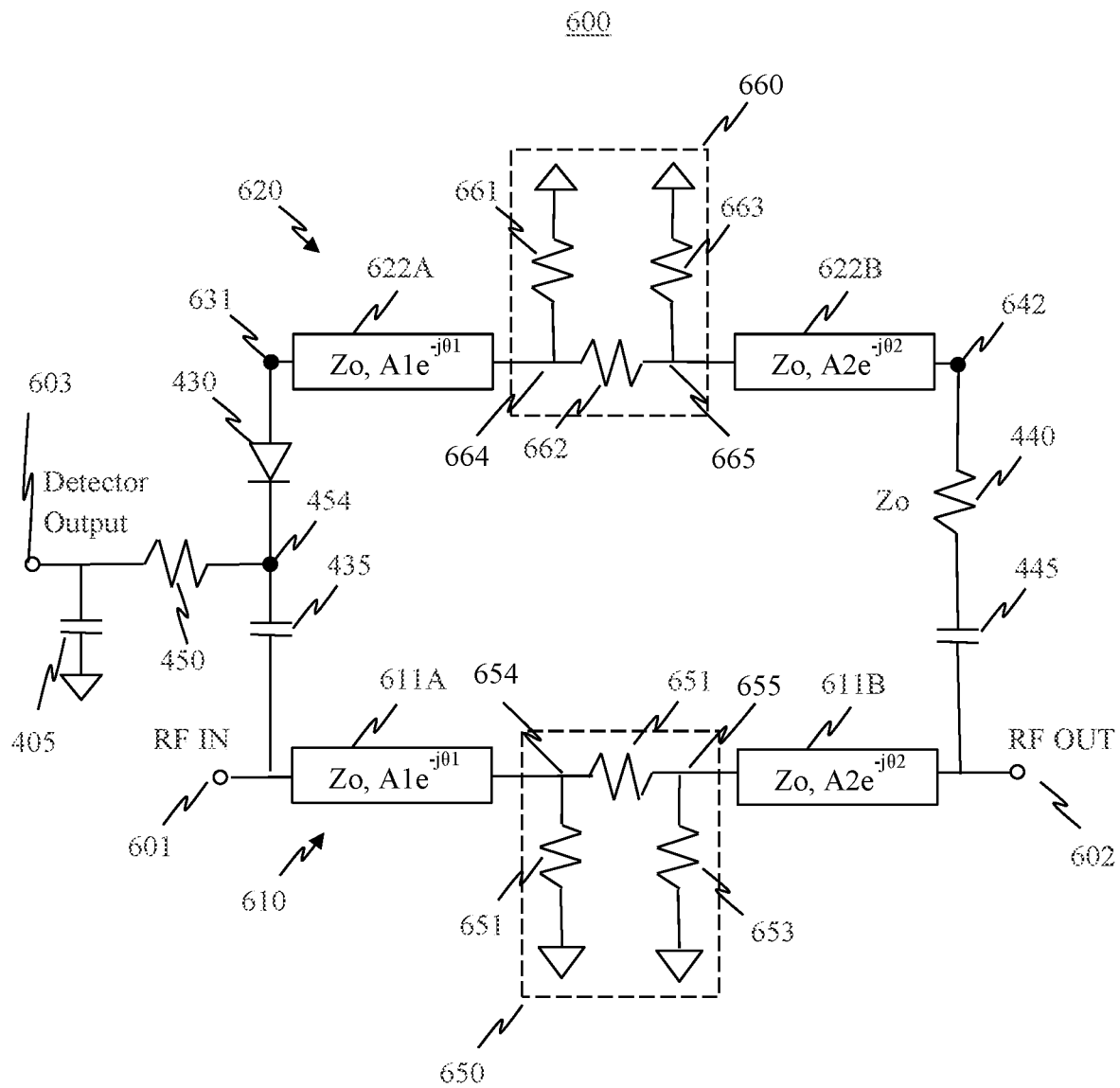
FIG. 6 is a simplified schematic diagram of a low loss directional power detector, including matched attenuators shown in the directional coupling network of FIG. 2, according to a representative embodiment.

FIG. 6 is a simplified schematic diagram of a low loss directional power detector, including matched attenuators as shown in the directional coupling network of FIG. 2, according to a representative embodiment. In particular, the detector bias resistors shown in FIG. 6 are incorporated into matched attenuators.

Referring to FIG. 6, a directional power detector 600 includes a first transmission path 610 including a first attenuator 650 connected between a first transmission line segment 611A and a second transmission line segment 611B, and a second transmission path 620 including a second attenuator 660 connected between a first transmission line segment 622A and a second transmission line segment 622B. In other words, the first attenuator 650 divides the first transmission line into first and second transmission line segments 611A and 611B, and the second attenuator 660 divides the second transmission line into first and second transmission line segments 622A and 622B. The characteristic impedance for each of the first transmission line segments 611A and 622A and each of the second transmission line segments 611B and 622B is the characteristic impedance Zo. The characteristic impedance for each of the first attenuator 650 and the second attenuator 660 is also matched to the characteristic impedance Zo. The first transmission path 610 extends between an RF input port 601 and an RF output port 602.

The combined first and second transmission line segments 611A and 611B in the first transmission path 610 and the combined first and second transmission line segments 621A and 621B in the second transmission path 620 have the same characteristics overall in terms of characteristic impedance and forward voltage transmission gain. However, in the depicted embodiment, the first attenuator 650 effectively divides the characteristic impedance and forward voltage transmission gain of the first transmission path 610 into the first and second transmission line segments 611A and 611B, and the second attenuator 660 effectively divides the characteristic impedance and forward voltage transmission gain of the second transmission path 620 into the first and second transmission line segments 622A and 622B. Therefore, referring to the first transmission path 610, the characteristic impedance and forward voltage transmission gain of the first transmission line segment 611A is indicated by Zo, $A1e^{-j\theta 1}$ and the characteristic impedance and forward voltage transmission gain of the second transmission line segment 611B is indicated by Zo, $A2e^{-j\theta 2}$. Likewise, referring to the second transmission path 620, the characteristic impedance and forward voltage transmission gain of the first transmission line segment 622A is indicated by Zo, $A1e^{-j\theta 1}$ and the characteristic impedance and forward voltage transmission gain of the second transmission line segment 622B is indicated by Zo, $A2e^{-j\theta 2}$. In addition, the first attenuator 650 has a first forward voltage transmission gain magnitude Aa1 and phase θa1, and the second attenuator 660 has a second forward voltage transmission gain magnitude Aa2 and phase θa2.

Accordingly, the forward voltage transmission gain of each of the first and second transmission paths 610 and 620 has a magnitude equal to the product of the amplitudes of the individual transmission line segments and attenuator, and a phase equal to the sum of the phases of the individual transmission line segments and attenuator. So, the forward voltage transmission gain of the first transmission path 610 is A=(A1)(A2)(Aa1) and θ=θ1+θ2+θa1, and the forward voltage transmission gain of the second transmission path 620 is A=(A1)(A2)(Aa2) and θ=θ1+θ2+θa2.

The first and second attenuators 650 and 660 are substantially the same as the first and second attenuators 250 and 260 discussed above with reference to FIG. 2. That is, the first attenuator 650 includes a first resistor 651 connected between a node 654 in the first transmission path 610 and ground, a second resistor 652 connected between the node 654 and a node 655 also in the first transmission path 610, and a third resistor 653 connected between the node 655 and ground. The second attenuator 660 includes a first resistor 661 connected between a node 664 in the second transmission path 620 and ground, a second resistor 662 connected between the node 664 and a node 665 also in the second transmission path 620, and a third resistor 663 connected between the node 665 and ground.

Likewise, the remaining circuitry of the directional power detector 600 is substantially the same as that of the directional power detector 500 discussed above with reference to FIG. 5. That is, the first coupling capacitor 435 and detector diode 430 are connected in series between the first transmission path 610 at the RF input port 601 and the second transmission path 620 at a node 631. The second coupling capacitor 445 and resistor 440 are connected in series between the first transmission path 610 at the RF output port 602 and the second transmission path 620 at a node 642. Also, the directional power detector 600 further includes the first shunt resistor 450 connected between the node 454 and detector output 603, where the node 454 is located between the diode 430 and the capacitor 435. The first shunt resistor 450 has a very large resistance value as compared to the impedance Zo, e.g., of the resistor 440. The detector output 603 is RF connected to ground through the shunt capacitor 405 and DC connected to ground through transmission line segment 622A and first and third resistors 661 and 663 in the second attenuator 660. The detector output 603 outputs a DC detector voltage proportional to the square of the RF differential voltage between nodes 631 and 454 indicating the power of an RF signal input at the RF input port 601, and outputs no voltage in response to an RF signal input at the RF output port 602. Again, because of the presence of the first shunt resistor 450, the voltage gain equations (1), (2) and (3) do not strictly apply to the directional power detector 600. The practical effect of the first shunt resistor 450 is to degrade the directivity, meaning that the RF voltage between the nodes 454 and 631 is not exactly zero when an RF signal enters the RF output port 602, and to increase insertion loss.

Figure 7:
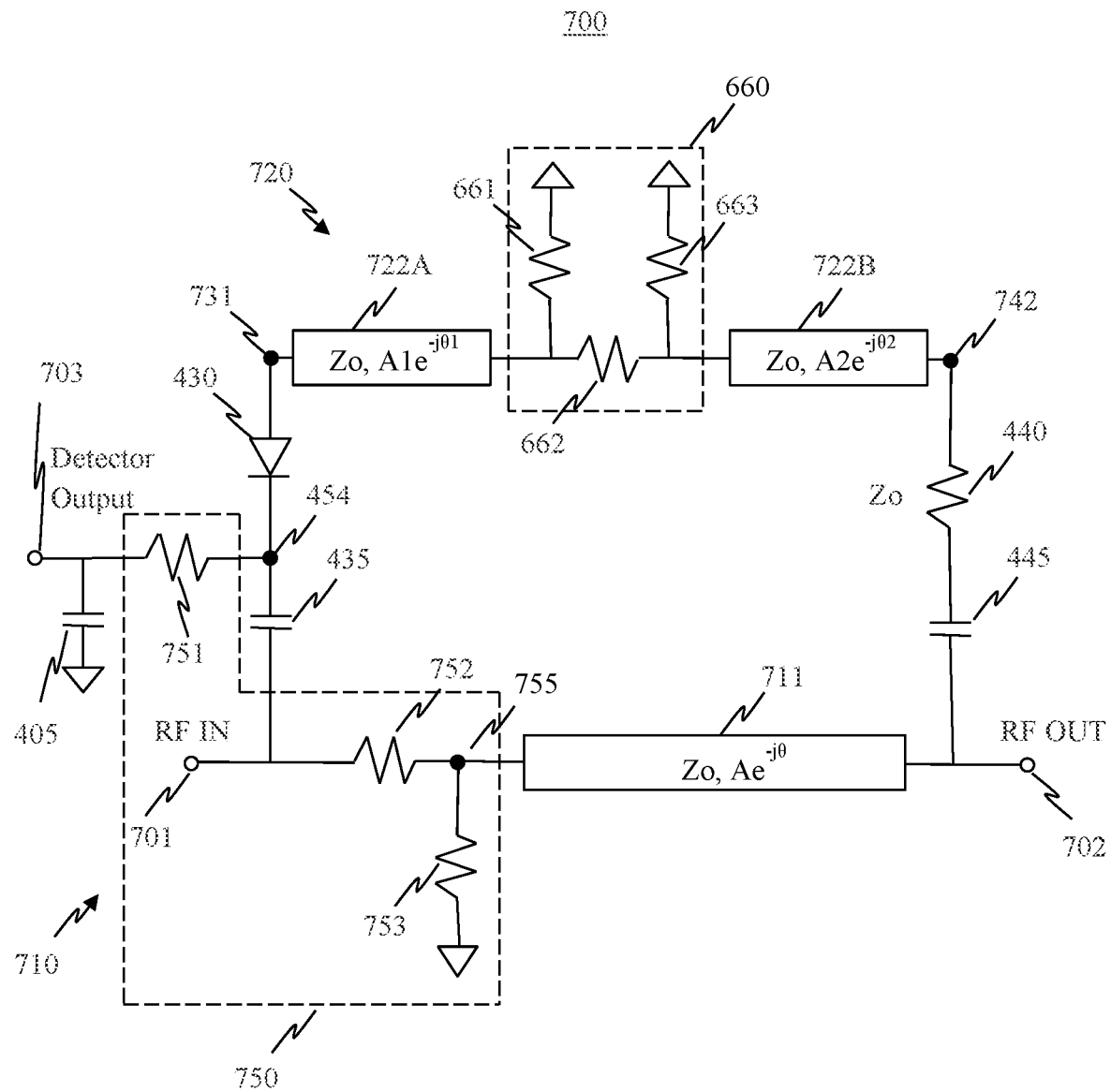
FIG. 7 is a simplified schematic diagram of a low loss directional power detector including matched attenuators, according to a representative embodiment.

FIG. 7 is a simplified schematic diagram of a low loss directional power detector, detector bias resistors incorporated into matched attenuators, according to a representative embodiment. including matched attenuators and no transmission lines Referring to FIG. 7, a directional power detector 700 includes a first transmission path 710 including a first transmission line 711 and a first attenuator 750 connected between a detector output 703 and the first transmission line 711. The directional power detector 700 further includes and a second transmission path 720 including the second attenuator 660 connected between a first transmission line segment 622A and a second transmission line segment 622B, discussed above with reference to the directional power detector 600. The characteristic impedance for each of the first attenuator 750 and the second attenuator 660 is matched to the characteristic impedance Zo. The first transmission path 710 extends between an RF input port 701 and an RF output port 702.

The first attenuator 750 includes a first resistor 751 connected between the node 454 and the detector output 703, where the node 454 is located between the detector diode 430 and the first capacitor 435. The first resistor 751 also acts as a bias resistor for the detector output 703, which is RF connected to ground through the shunt capacitor 405, and DC grounded through the first transmission line segment 622A and the first and third resistors 661 and 663. Again, the DC detector voltage output at the detector output 703 is proportional to the square of the voltage difference across the detector diode 430 between node 731 and node 454. The first attenuator 750 further includes a second resistor 752 connected between a node 755 and the RF input port 701, and a third resistor 753 connected between the node 755 and ground. The detector output 703 provides a differential DC detector voltage indicating the power of an RF signal input at the RF input port 701. No voltage is output in response to an RF signal input at the RF output port 702.

The forward voltage transmission gain of the second transmission path 720 is the same as discussed above with reference to the second transmission path 620 in FIG. 6. The forward voltage transmission gain of the first transmission path 710 is based on the forward voltage transmission gain of first transmission line 711 and the forward voltage transmission gain of the first attenuator 750. That is, the first transmission line 711 has characteristic impedance Zo and forward voltage transmission gain amplitude and phase $Ae^{-j\theta}$, and the first attenuator 750 has characteristic impedance Zo and forward voltage transmission gain amplitude and phase $Ae^{-j\theta}$. Thus, the total forward voltage transmission gain amplitude of the first transmission path 710 is the product of the forward voltage transmission gain amplitudes of the first transmission line 711 and the first attenuator 750, and the total forward voltage transmission gain phase of the first transmission path 710 is the sum of the forward gain phases of the first transmission line 711 and the first attenuator 750.

Figure 8:
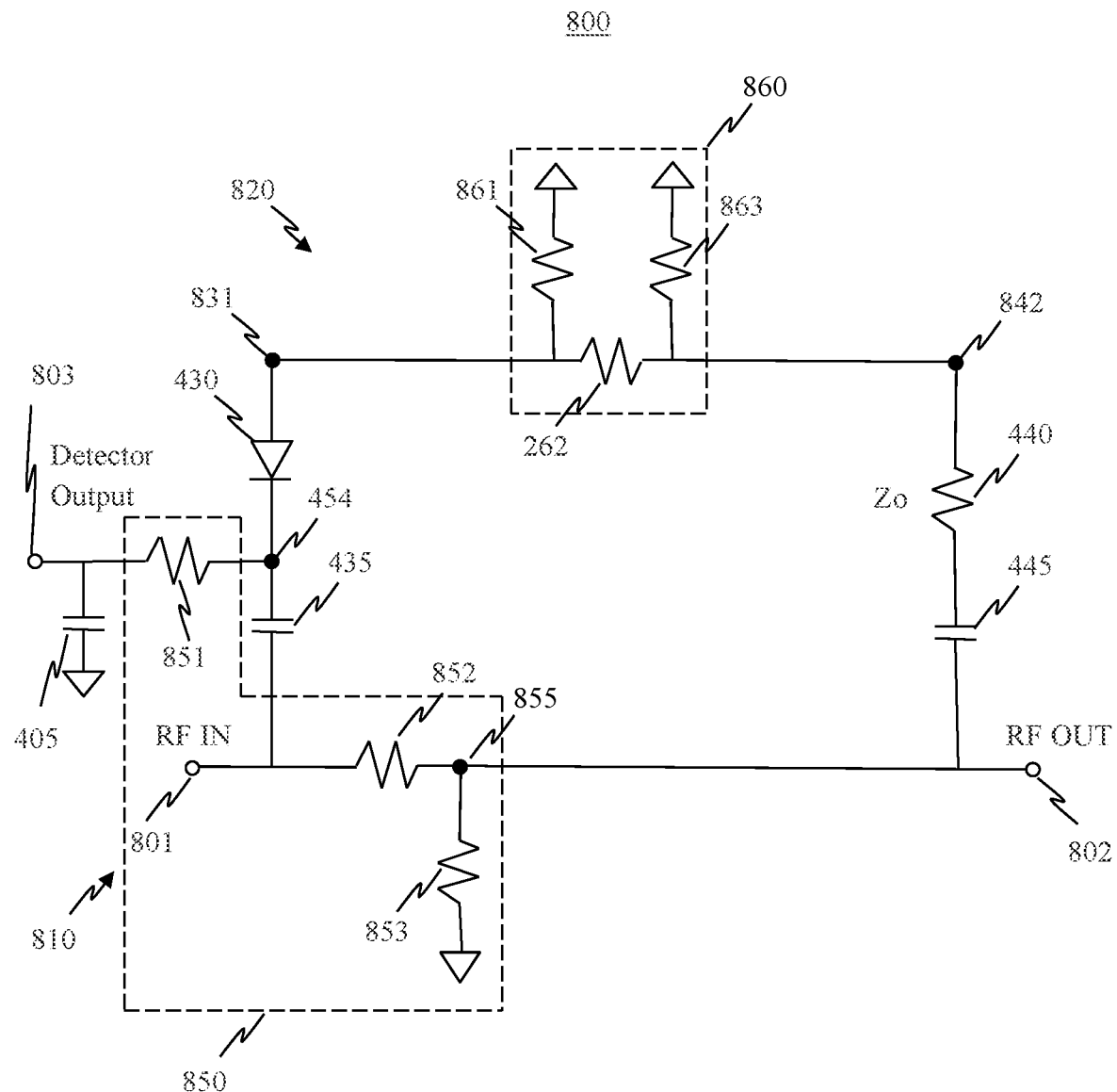
FIG. 8 is a simplified schematic diagram of a low loss directional detector that does not use transmission lines according to a representative embodiment.

FIG. 8 is a simplified schematic diagram of a low loss directional power detector, including matched attenuators as shown in the directional coupling networks of FIG. 3 and FIG. 7, according to a representative embodiment. In particular, the directional power detector includes first and second transmission paths with no transmission lines as shown in FIG. 3 and matched attenuators as shown in FIG. 7.

Referring to FIG. 8, a directional power detector 800 includes a first transmission path 810 that consists of first attenuator 850, and a second transmission path 820 that consists of second attenuator 860. In the depicted configuration, the first attenuator 850 is connected to the RF input port 801 and the RF output port 802, and the second attenuator 860 connects node 842 and node 831. As discussed above, the phase of the transmission line segments in FIG. 7 are all set to zero in FIG. 8. This means that the input and output ports of the first and second attenuators 850 and 860 are directly connected to the rest of the circuit. The first and second attenuators 850 and 860 are matched to characteristic impedance Zo even though there are no physical transmission lines.

The first attenuator 850 includes a first resistor 851 connected between the node 454 and the detector output 803, where the node 454 is located between the detector diode 430 and the first capacitor 435. The first resistor 851 also acts as a bias resistor for the detector output 803, which is RF connected to ground through the shunt capacitor 405. The first attenuator 850 further includes a second resistor 852 connected between a node 855 in the first transmission path 810 and the RF input port 801, and a third resistor 853 connected between the node 855 and ground. The second attenuator 860 includes a first resistor 861 connected between the node 864 in the second transmission path 820 and ground, a second resistor 862 connected between the node 864 and a node 865 also in the second transmission path 820, and a third resistor 863 connected between the node 865 and ground.

Accordingly, the forward voltage transmission gain amplitude A of the first transmission path 810 is the amplitude of the forward voltage transmission gain of the first attenuator 650, and the forward voltage transmission gain phase θ of the first transmission path 810 is the forward voltage transmission gain phase of the first attenuator 850. Likewise, the forward voltage transmission gain amplitude A of the second transmission path 820 is the amplitude of the forward voltage transmission gain of the second attenuator 860, and the forward voltage transmission gain phase θ of the second transmission path 820 is the forward voltage transmission gain phase of the second attenuator 860. The transmission path between the RF input port 801 and the RF output port 802 is the first attenuator 850. The transmission path between the nodes 842 and 831 is the second attenuator 860.

In alternative embodiments, the detector diode may be replaced with another type of differential detector that requires a differential input signal in any of the above illustrative configurations, such as a differential amplifier or a mixer, for example, without departing from the scope of the present teachings. Also, two directional power detectors may be implemented in series with one another, where one directional power detector is arranged in the forward direction and the other is arranged in the reverse direction, to provide dual-directional power sensing.

Figure 9:
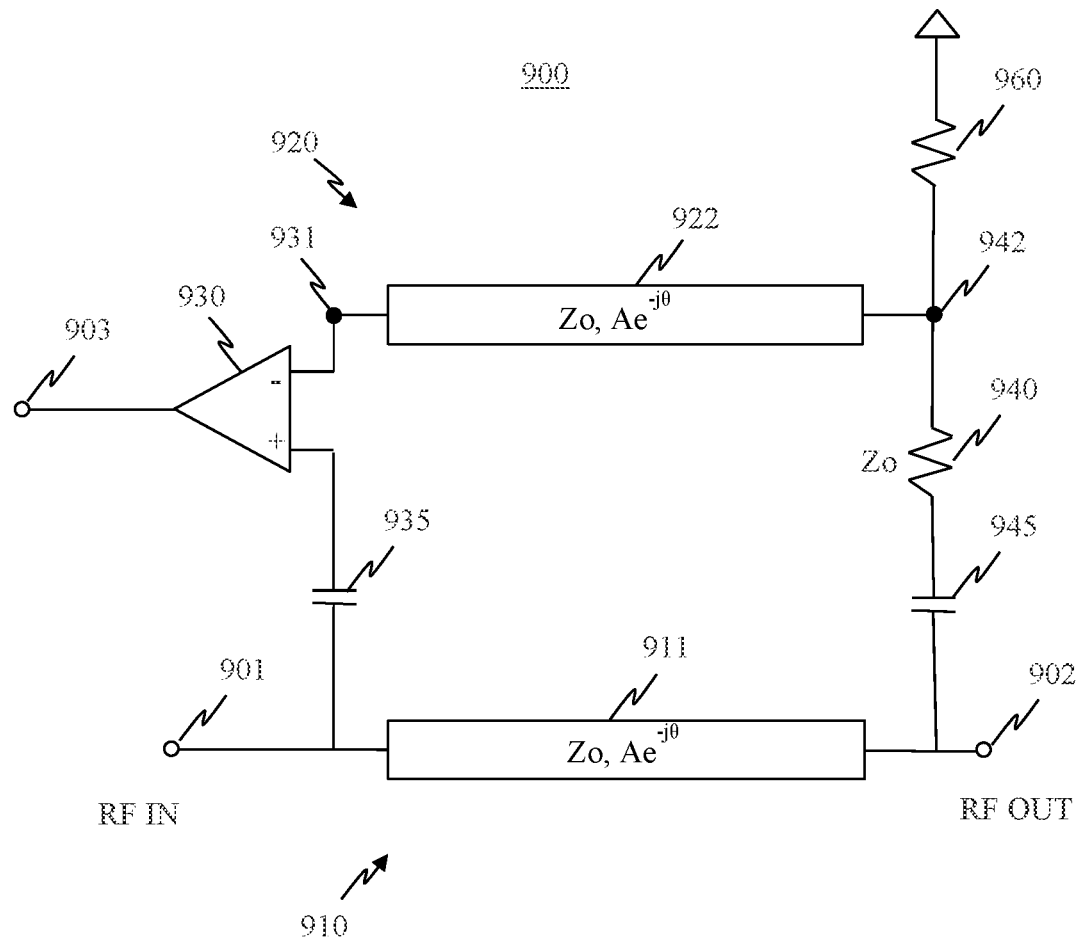
FIG. 9 is a simplified schematic diagram of a low loss directional power detector, including the directional coupling network of FIG. 1, according to another representative embodiment.

FIG. 9 is a simplified schematic diagram of a low loss directional power detector, including the directional coupling network of FIG. 1, according to another representative embodiment, in which a detector diode has been replaced by a differential amplifier. That is, the directional power detector in FIG. 9 is essentially the same as the directional power detector in FIG. 5, where the detector diode 430 has been replaced by a differential amplifier 930 (and no shunt capacitor is included), as described below.

Referring to FIG. 9, a directional power detector 900 includes a first transmission path 910 and a second transmission path 920, where the first transmission path 910 extends between an RF input port 901 and an RF output port 902. The first transmission path includes a first transmission line 311 and the second transmission path 920 includes a second transmission line 922, where the first and second transmission lines 911 and 922 have the same characteristics in terms of characteristic impedance and forward voltage transmission gain, indicated by Zo, $Ae^{-j\theta}$.

The differential amplifier 930 (or alternatively, a mixer or other circuit element that has a differential voltage input) is connected in series with a first capacitor 935 between the first transmission path 910 at the RF input port 901 and the second transmission path 920 at a node 931. The differential amplifier 930 has amplifier inputs connected to the first transmission path 910 at the RF input port 901 and to the second transmission path 920 at the node 931, and an amplifier output that provides the differential voltage to be output at the detector output 903. For example, the differential amplifier 930 may have a positive input connected to the second transmission path 920 at the node 931, and a negative input connected to the first transmission path 910 through the first capacitor 935, although the positive and negative inputs may be reversed, without departing from the scope of the present teachings. A voltage at the detector output 903 is proportional to the differential voltage at the input to the differential amplifier 930 indicating the amplitude of an RF signal input at the RF input port 901, and no voltage is output in response to an RF signal input at the RF output port 902.

A second capacitor 945 and a resistor 940 having a value Zo are connected in series between the first transmission path 910 at the RF output port 902 and the second transmission path 920 at a node 942. A second shunt resistor 960 is a coupled arm connected between the node 942 and ground. The ground bias of the directional power detector 900 is through the second shunt resistor 960.

When the differential detector is implemented as a mixer, it is connected in the same manner as the differential amplifier. The mixer has inputs connected to the first transmission path 910 at the RF input port 901 and to the second transmission path 920 at the node 931. Alternative embodiments may include directional power detectors shown in FIGS. 4, 6, 7, and 8, for example, where the corresponding detector diodes are replaced with differential amplifiers or mixers (and shunt capacitors are not included), without departing from the scope of the present teachings.

For purposes of illustration and not limitation, a representative directional power detector 500 of FIG. 5 was implemented as an integrated circuit, and various characteristic were measured, including insertion loss, return loss, detector voltage and directivity. As mentioned above, the first and second shunt resistors 450 and 460 are required bias resistors for the directional power detector 500, but can degrade directivity and insertion loss. When each of the first and second shunt resistors 450 and 460 has a large value, the performance of the coupling network is not affected. To achieve perfect directivity, these resistors could have been embedded in matched attenuators, as shown in FIG. 6 or 7, for example. The choice was made not to use matched attenuators as they increase insertion loss, so the directional power detector 500 as implemented has lower insertion loss at the expense of degraded directivity. Also the voltage gain equations (1), (2) and (3) discussed above with reference to FIG. 1 require that there is no electromagnetic coupling between the first and second transmission lines in in the first and second transmission paths, but the close proximity of the transmission lines on the integrated circuit implementation allowed some coupling to occur.

Circuit values were adjusted based on simulation to compensate for the electromagnetic coupling and the effect of the first and second shunt resistors 450 and 460. This included changing the value of impedance Zo for the first and second transmission lines 411 and 422 and the value of the resistor 440. The illustrative circuit values used for the implementation are as follows: capacitance of the first capacitor 435 is 0.2 pF, capacitance of the second capacitor 445 is 0.5 pF, resistance (Rvideo) of the detector diode 430 is 1.5 kOhms, impedance of the resistor 440 is 42 Ohms, resistance of the first shunt resistor 450 is 2.5 kOhms, resistance of the second shunt resistor 460 is 2.5 kOhms, and the characteristic impedance and phase change of each of the first and second transmission paths 411 and 422 is 60 Ohms, 0.84 ps. The insertion loss is low (e.g., less than 1 dB) over the frequency measured and the directivity achieved is about −14 dB. While not perfect, this directivity is acceptable for many applications, such as automatic level control (ALC) circuits.

Figure 10:
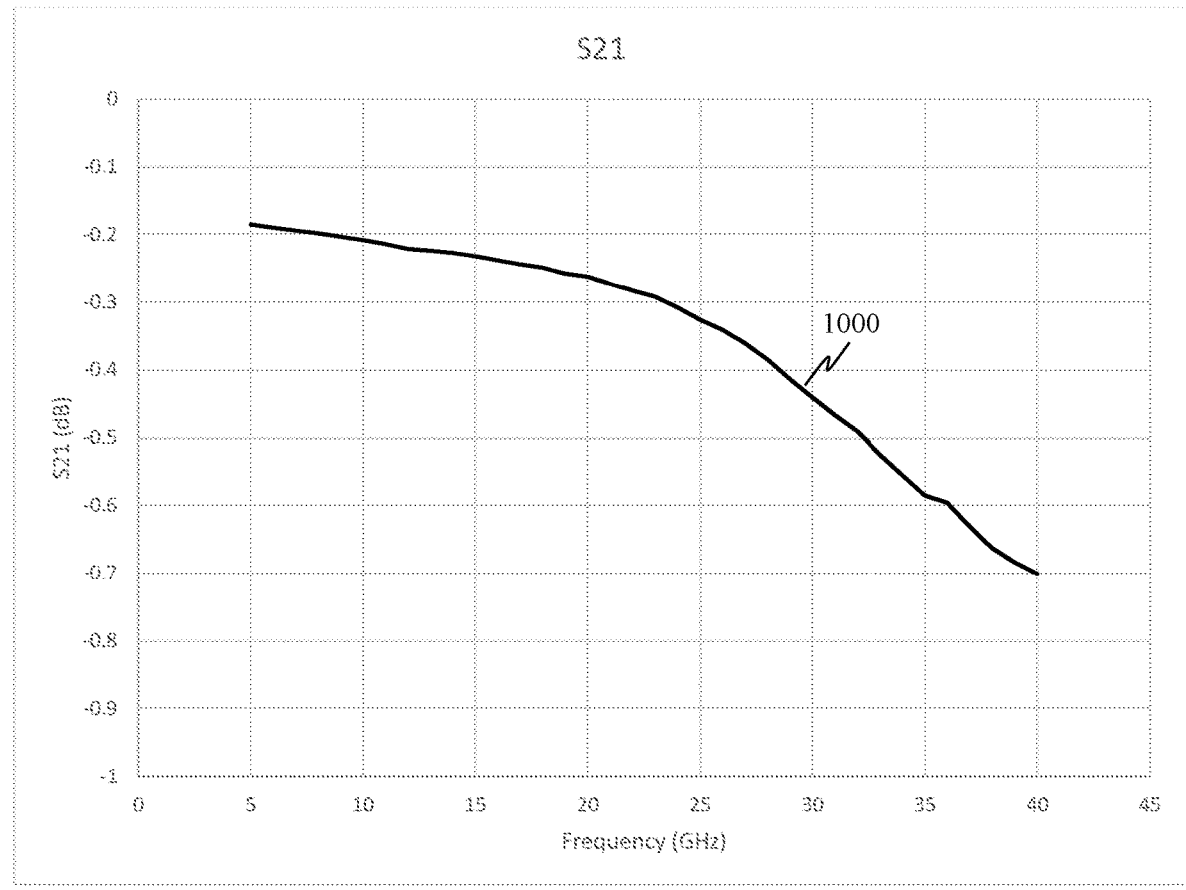
FIG. 10 is a graph showing forward transmission gain ($S_{21}$) versus frequency of the directional power detector of FIG. 5, according to a representative embodiment.

FIG. 10 is a graph showing forward transmission gain ($S_{21}$) versus frequency of the directional power detector of FIG. 5, according to a representative embodiment, where the directional power detector 500 has the representative circuit values identified above.

Referring to FIG. 10, trace 1000 shows the forward transmission gain in dB as a function of the frequency of the input forward RF signal. In particular, the forward transmission gain from the RF input port 401 to the RF output port 402 is indicated by S-parameter $S_{21}$. A forward transmission gain of 0 dB would be ideal and −1 dB is considered good for most applications at these frequencies. In the depicted example, the forward transmission gain is between about −0.2 dB and about −0.7 dB.

Figure 11:
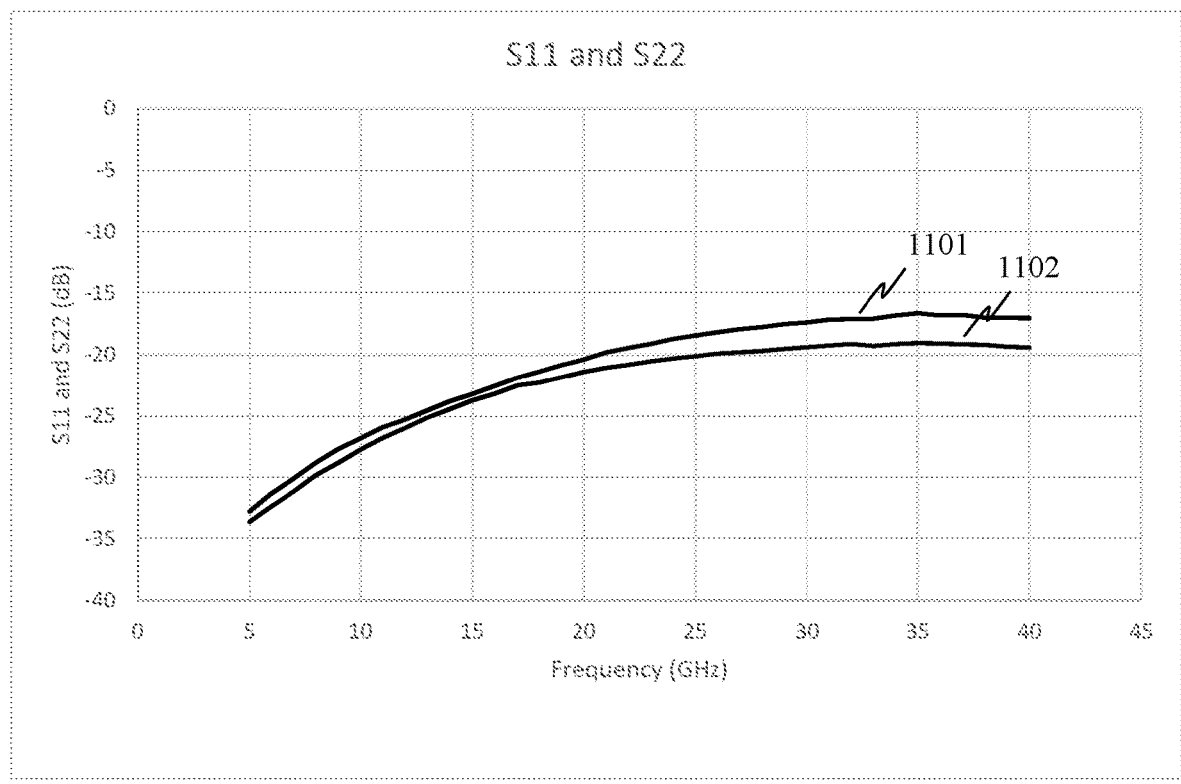
FIG. 11 is a graph showing forward reflection gain ($S_{11}$) and reverse reflection gain ($S_{22}$) versus frequency of the directional power detector of FIG. 5, according to a representative embodiment.

FIG. 11 is a graph showing forward reflection gain ($S_{11}$) and reverse reflection gain ($S_{22}$) versus frequency of the directional power detector of FIG. 5, according to a representative embodiment, where the directional power detector 500 has the representative circuit values identified above.

Referring to FIG. 11, trace 1101 shows the forward reflection (return) gain in dB as a function of the frequency of an input forward RF signal, and trace 1122 shows the reverse reflection (return) gain in dB as a function of the frequency of an input reverse RF signal. A return gain of negative infinity (dB) is ideal performance, but −15 dB is acceptable for many applications. In the depicted example, the forward reflection gain is between about −33 dB and about −17 dB, and the reverse reflection gain is between about −34 dB and about −20 dB.

Figure 12:
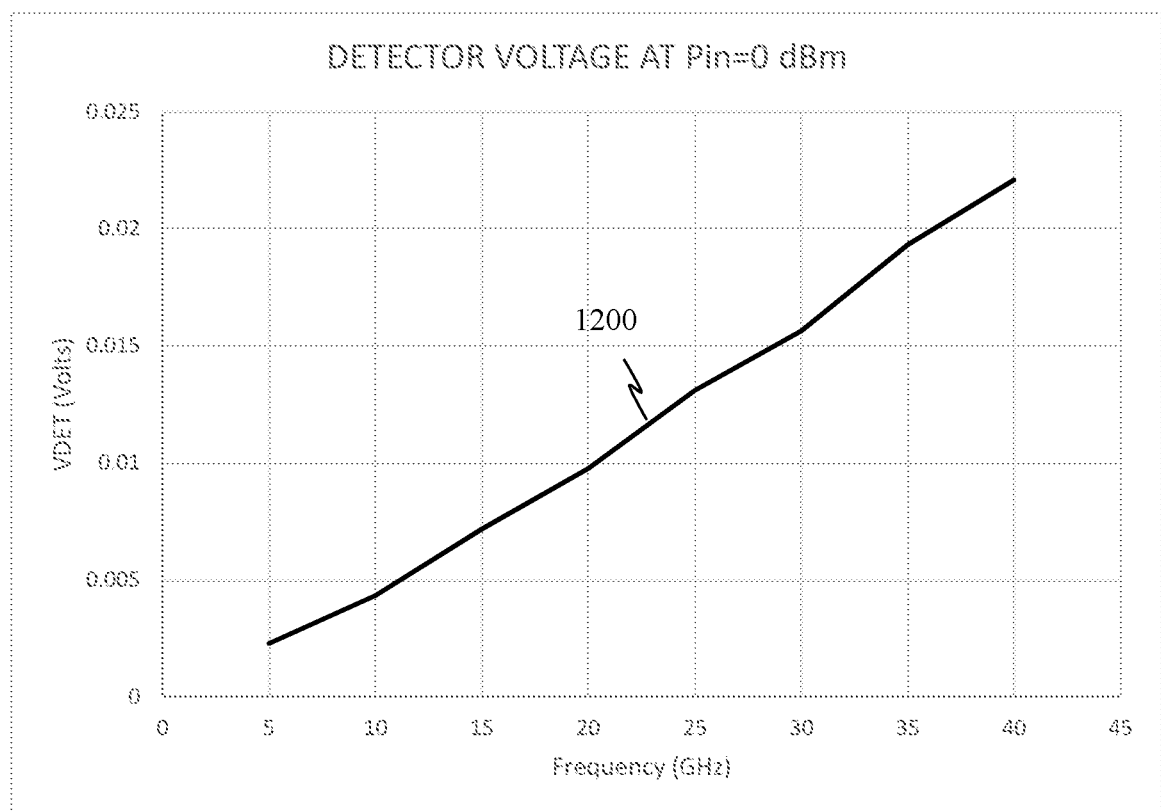
FIG. 12 is a graph showing voltage versus frequency of the directional power detector of FIG. 5, according to a representative embodiment.

FIG. 12 is a graph showing voltage versus frequency of the directional power detector of FIG. 5, according to a representative embodiment, where the directional power detector 500 has the representative circuit values identified above.

Referring to FIG. 12, trace 1200 shows the DC detector voltage of the directional power detector 500 measured at the detector output 403 in volts in response to the forward RF signal input at the RF input port 401. This corresponds to the square of the RF differential voltage across the detector diode 430. The output of the directional power detector 500 is sloped upward as the frequency of the forward RF signal increases, going from about 0.003V at 5 GHz to about 0.022V at 40 GHz. The upward slope is inherent in the various embodiments for conditions that have low insertion loss (as predicted by the voltage gain equations (1), (2) and (3) associated with FIG. 1). The variation in detector response for this representative directional power detector is about 2-to-1 over an octave frequency band. This is 3 dB variation since the DC detector output is proportional to the square of the RF voltage.

Figure 13:
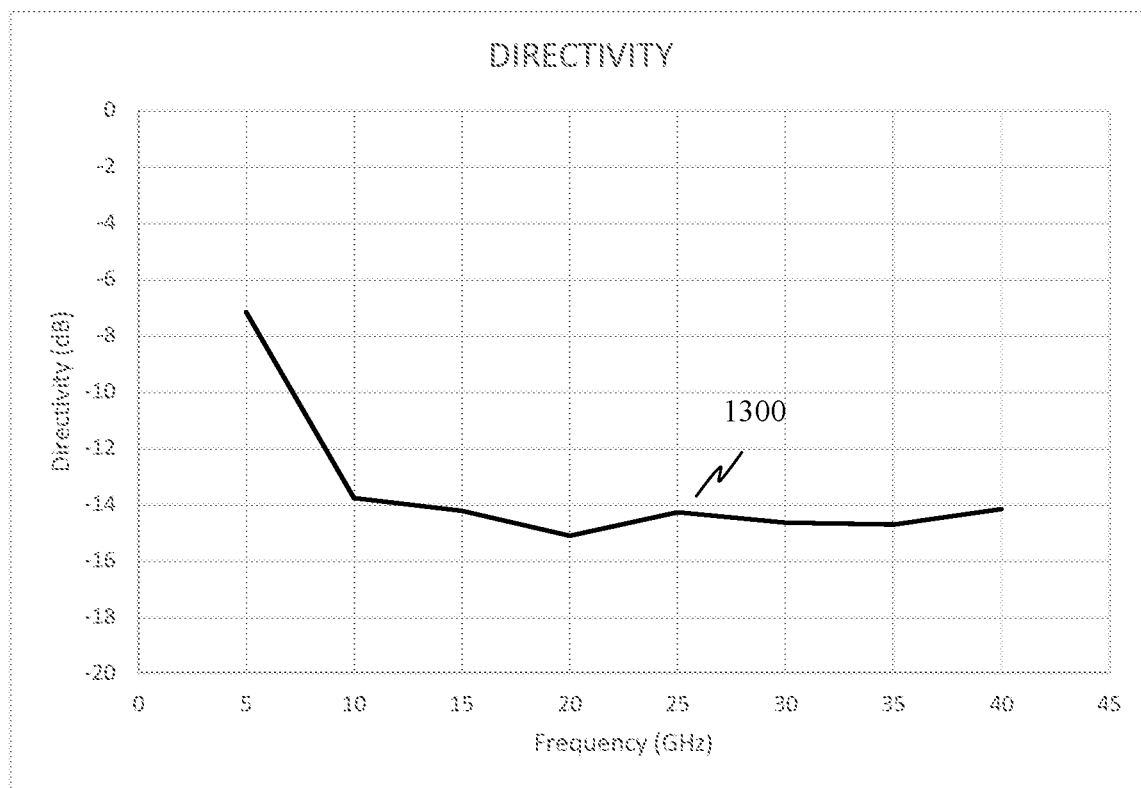
FIG. 13 is a graph showing directivity versus frequency of the directional power detector of FIG. 5, according to a representative embodiment.

FIG. 13 is a graph showing directivity versus frequency of the directional power detector of FIG. 5, according to a representative embodiment, where again the directional power detector 500 has the representative circuit values identified above.

Referring to FIG. 13, trace 1300 shows the directivity of the directional power detector 500, which is the DC detector voltage at the detector output 403 in response to the reverse RF signal input at the RF output port 402 divided by the DC detector voltage output at the detector output 403 in response to the forward RF signal input at the RF input port 401 plotted in dB. The ideal implementation, indicated by equations (1), (2) and (3), predicts perfect directivity, or negative infinity dB, while measured directivity is relatively constant at about −14 dB. This was due primarily to the first and second shunt resistors 450 and 460 and undesired electromagnetic coupling between the first and second transmission lines 411 and 422.

In alternative embodiments, the detector diode may be replaced with other types of differential detectors that require a differential input signal, such as a differential amplifier or a mixer, for example, without departing from the scope of the present teachings. Also, two directional power detectors may be implemented in series with one another, where one directional power detector is arranged in the forward direction and the other is arranged in the reverse direction, to provide dual-directional power sensing.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A directional power detector device comprising:
   a directional coupling network comprising:
      a first transmission path connected between a radio frequency (RF) input port and an RF output port, the first transmission path having a voltage transmission gain A, phase θ and characteristic impedance Zo;
a second transmission path having the same voltage transmission gain A, phase θ and characteristic impedance Zo; and
a resistor connected between the first transmission path at the RF output port and the second transmission path, wherein the resistor has a value the same as the characteristic impedance Zo;
a detector diode including an anode connected to the second transmission path and a cathode;
a first capacitor connected between the cathode of the detector diode and the RF input port; and
a detector output connected to the cathode of the detector diode,
wherein the detector output is configured to output a DC detector voltage when a forward RF signal is applied to the RF input port, and outputs zero DC detector voltage when a reverse RF signal is applied to the RF output port.

2. The directional power detector device of claim 1, further comprising:
a first shunt resistor having a first resistance connected between the cathode of the detector diode and the detector output; and
a second shunt resistor having a second resistance connected between the resistor and ground,
wherein the first and second shunt resistors are configured to provide DC connections for the detector diode, and wherein each of the first and second resistances are large compared to the characteristic impedance Zo, such that the first and second resistances are large enough to substantially prevent current flow to ground.

3. The directional power detector device of claim 2, wherein each of the first and second resistances is at least about 20 times greater than the characteristic impedance Zo.

4. The directional power detector device of claim 1, further comprising:
a second capacitor connected between the resistor and the RF output port.

5. A directional power detector device comprising:
a first transmission path, comprising a first transmission line, connected between a radio frequency (RF) input port and an RF output port, the first transmission line having a voltage transmission gain A, phase θ and characteristic impedance Zo;
a second transmission path, comprising a second transmission line having the same voltage transmission gain A, phase θ and characteristic impedance Zo;
a resistor connected between the first transmission path at the RF output port and the second transmission path, wherein the resistor has a value the same as the characteristic impedance Zo; and
a differential detector connected between the first transmission path at the RF input port and the second transmission path, wherein the differential detector is configured to output a DC detector voltage when a forward RF signal is applied to the RF input port, and to output zero DC detector voltage when a reverse RF signal is applied to the RF output port.

6. The directional power detector device of claim 5, wherein the differential detector comprises a diode having a cathode connected to the first transmission path at the RF input port, and an anode connected to the second transmission path, and
wherein the DC detector voltage is output from a detector output at the cathode.

7. The directional power detector device of claim 6, further comprising:
a first capacitor connected between the cathode of the diode and the RF input port; and
a second capacitor connected between the resistor and the RF output port.

8. The directional power detector device of claim 7, further comprising:
a first shunt resistor connected between the cathode of the diode and the detector output; and
a second shunt resistor connected between the resistor and ground.

9. The directional power detector device of claim 6, further comprising:
a first shunt resistor having a first resistance connected between the cathode of the diode and the detector output; and
a second shunt resistor having a second resistance connected between the resistor and ground, wherein the first shunt resistor and the second shunt resistor are configured to provide DC connections for the diode.

10. The directional power detector device of claim 9, wherein each of the first and second resistances are large compared to the characteristic impedance Zo, such that the first and second resistances are large enough to substantially prevent current flow to ground.

11. The directional power detector device of claim 10, wherein each of the first and second resistances is at least about 20 times greater than the characteristic impedance Zo.

12. The directional power detector device of claim 5, wherein the differential detector comprises a differential amplifier having inputs connected to the first transmission path at the RF input port and to the second transmission path.

13. The directional power detector device of claim 12, wherein the differential amplifier has a positive input connected to the first transmission path at the RF input port and a negative input connected to the second transmission path.

14. The directional power detector device of claim 13, further comprising:
a first capacitor connected between the positive input of the differential amplifier and the RF input port; and
a second capacitor connected between the resistor and the RF output port.

15. The directional power detector device of claim 5, wherein the differential detector comprises a mixer with a differential input having a first input connected to the first transmission path at the RF input port, a second input connected to the second transmission path.

16. The directional power detector device of claim 15, further comprising:
a first capacitor connected between the mixer and the RF input port; and
a second capacitor connected between the resistor and the RF output port.

17. The directional power detector device of claim 5, further comprising:
a first attenuator in the first transmission path; and
a second attenuator in the second transmission path.

18. The directional power detector device of claim 17, wherein the first attenuator comprises a first resistor connected between the differential detector and a detector output, a second resistor connected to the RF input port, and a third resistor connected between the second resistor and ground.

19. The directional power detector device of claim 17, wherein the second attenuator comprises one of a pi-attenuator or a T-attenuator.

20. The directional power detector device of claim 17, wherein the second attenuator comprises a first resistor connected between a first node in the second transmission line and ground, a second resistor connected between the first node and a second node in the second transmission line, and a third resistor connected between the second node and ground.

21. A directional coupler comprising:
- a first transmission path connected between a radio frequency (RF) input and an RF output, the first transmission path including a first transmission line having a voltage transmission gain A, phase θ and characteristic impedance Zo;
- a second transmission path including a second transmission line having the same voltage transmission gain A, phase θ and characteristic impedance Zo;
- a first resistor connected between the first transmission path at the RF input and the second transmission path, wherein a voltage across the first resistor is a differential output of the directional coupler; and
- a second resistor connected between the first transmission path at the RF output and the second transmission path, wherein the second resistor has a value the same as the characteristic impedance Zo.

22. The directional coupler of claim 21, further comprising:
- a first attenuator in the first transmission path, the first attenuator comprising at least one resistor connected between the first transmission path and ground; and
- a second attenuator in the second transmission path, the second attenuator comprising at least one resistor connected between the first transmission path and ground.

23. The directional coupler of claim 22, wherein each of the first attenuator and the second attenuator has the same characteristic impedance Zo as the first transmission path and the second transmission path, and wherein the first attenuator has the same forward voltage transmission gain as the second attenuator.

24. The directional coupler of claim 21, wherein the first and second transmission lines are matched single-mode transmission lines.

* * * * *